(12) United States Patent
Yamaguchi

(10) Patent No.: US 7,256,410 B2
(45) Date of Patent: Aug. 14, 2007

(54) SOLID STATE RELAY

(75) Inventor: Hiroshi Yamaguchi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/612,162

(22) Filed: Dec. 18, 2006

(65) Prior Publication Data

US 2007/0085045 A1 Apr. 19, 2007

Related U.S. Application Data

(62) Division of application No. 11/065,439, filed on Feb. 25, 2005.

(30) Foreign Application Priority Data

Mar. 3, 2004 (JP) .............................. 2004-059581

(51) Int. Cl.
*H01L 21/44* (2006.01)

(52) U.S. Cl. .................. 250/551; 250/239; 438/64; 438/124

(58) Field of Classification Search ................ 250/551, 250/239; 438/64, 106, 123, 124
See application file for complete search history.

(56) References Cited

U.S. PATENT DOCUMENTS 4,745,294 A 5/1988 Kohashi et al.

2003/0024964 A1 2/2003 Fujiwara
2004/0097017 A1* 5/2004 Shimanuki .................. 438/124
2005/0194552 A1* 9/2005 Yamaguchi ................. 250/551

FOREIGN PATENT DOCUMENTS

JP 5-206504 A 8/1993
JP 2001-127099 A 5/2001

* cited by examiner

Primary Examiner—John R. Lee
(74) Attorney, Agent, or Firm—Birch, Stewart, Kolasch & Birch, LLP

(57) ABSTRACT

A solid state relay is formed by mounting a light-emitting element on a light-emitting side lead frame, mounting a light-receiving element or a switching element which operates in response to the light-receiving element and signals from the light-receiving element on a light-receiving side lead frame, arranging these lead frames on the light-emitting side and the light-receiving side to opposite each other, and sealing into one package and is formed by mounting protective element that protects the light-emitting element or the light-receiving element on at least one of the lead frames and arranging the protective element or the protective element and the switching element inside a primary mold resin that seals the light-emitting element and the light-receiving element.

6 Claims, 7 Drawing Sheets

SOLID STATE RELAY

CROSS-REFERENCE TO RELATED APPLICATION

This application is a Divisional of co-pending application Ser. No. 11/065,439 filed on Feb. 25, 2005, which claims priority under 35 U.S.C § 119(a) on Patent Application No. 2004-059581 filed in Japan on Mar. 3, 2004, the entire content of which is hereby incorporated by reference.

BACKGROUND OF THE INVENTION

1. Field of the Invention

The present invention relates to solid state relays such as Triac output, MOS output or IGBT output, provided in various types of electronic devices as switching elements. The present invention relates especially to solid state relays best suited for electronic devices such as power supply devices, household electrical appliances, inverter control devices, and the like having circuits that transmit signals while electrically isolating input from the output.

2. Description of the Related Art

As shown in FIG. 12, for example, a conventional solid state relay is formed by mounting a light coupling element 91, a switching element 93 such as a transistor, a Triac, an IGBT, or a C-MOS switching element electrically connected to a light-receiving portion on the light coupling element 91, a chip resistor 94 serving as a protective element on the output side, a chip capacitor 95, and a chip resistor 96 serving as an LED limiting resistor (protective element on the input side) inside the light coupling element 91, on a metallic lead 92 with silver paste or high temperature solder, for example, and sealing with a black light blocking resin 97 in order to protect a chip mounting portion, ensure electrical isolation, and protect the light coupling element 91 from external stray light.

Here, in the light coupling element 91, a light path is formed by mounting an LED (used as a light-emitting element) and a photodiode, a phototransistor, a phototriac, a photovoltaic, or the like (used as a light-receiving element) on two opposing lead frames and sealing the two lead frames by a translucent resin, for example.

It should be noted that conventional solid state relays as described above are also disclosed in JP 2001-127099A and JP H5-206504A, for example.

However, in the above-described conventional solid state relay in which the light-emitting element, the light-receiving element, the switching element, and the protective elements such as the chip resistor and the chip capacitor are mounted, the two lead frames on which the light-emitting element and the light-receiving element are respectively mounted are first placed in opposition to each other and sealed with resin through transfer molding, for example, to fabricate the light coupling element, and this light coupling element, the switching element, and the protective elements are then mounted on a substrate of still another lead frame, for example, after which the substrate is sealed by resin.

In such a conventional method, the number of resin sealing steps and part mounting steps increases, and the degree of integration decreases. Thus, there is the problem that the costs rise and also the package size of the device becomes large.

The present invention was achieved in view of this situation, and it is an object of the present invention to provide a solid state relay that allows a simplification of the assembly steps and a miniaturization of the device.

SUMMARY OF THE INVENTION

In order to solve the above-described problems, a solid state relay of the present invention is formed by mounting a light-emitting element on a light-emitting side lead frame, mounting a light-receiving element or a light-receiving element and a switching element which operates in response to signals from the light-receiving element on a light-receiving side lead frame, arranging the light-emitting side and the light-receiving side lead frames in opposition to each other, and sealing the lead frames into one package, wherein a protective element that protects the light-emitting element or the light-receiving element is mounted on at least one of the lead frames, and the protective element or the protective element and the switching element are arranged inside a primary mold resin that seals the light-emitting element and the light-receiving element.

According to this aspect of the invention, because the light-emitting element, the receiving element, and the protective element or the light-emitting element, the light-receiving element, the protective element, and the switching element are sealed with the primary mold resin, by carrying out transfer molding once through a translucent resin, it is possible to form a light path and resin seal the elements (the light-emitting element, the light-receiving element, and the protective element, or the light-emitting element, the light-receiving element, the protective element, and the switching element) mounted on the lead frames.

Thus, because a conventional mounting step of a light coupling element can be omitted and the number of resin sealing and part mounting steps can be reduced, the assembly process is simplified and costs can be reduced.

Furthermore, because the solid state relay is manufactured by mounting the light-emitting element, the light-receiving element, the switching element, and the protective element on the two lead frames on the light-emitting side and the light-receiving side and sealing these elements with the primary mold resin, it is possible to increase a degree of integration, shrink the package size, and make the device smaller.

With the solid state relay of the present invention, it is possible to simplify the assembly process and the make the device smaller in this manner.

It should be noted that here the protective elements may be chip resistors and chip capacitors such as a snubber circuit, a light-emitting element limiting resistor or the like.

Furthermore, in the solid state relay of the above-noted configuration, the protective element may be arranged to be separated from opposing the lead frame and any of the light-emitting element, the light-receiving element, or the light-receiving element and the switching element mounted on this lead frame.

In this case, because the protective element is separated from the lead frame and any element of the light-emitting element, the light-receiving element, or the light-receiving element and the switching element mounted on this lead frame that are opposite the protective element, in the solid state relay of the above-noted configuration, an electrical isolation distance between the light-receiving element and the light-emitting element within the device can be ensured. Thus, even if a protective element that is thicker than the light-emitting element and the light-receiving element is mounted, the electrical isolation distance between the light-receiving element and the light-emitting element within the device can be ensured, for example.

Furthermore, in the solid state relay of the above-noted configuration, the protective element may be mounted opposite a region where the lead frame is not present.

In this case, because neither the lead frame nor any of the other light-emitting element, the light-receiving element, or the switching element is present in the region opposite the protective element, in the solid state relay of the above-noted configuration, the electrical isolation distance between the light-receiving element and the light-emitting element within the device can be ensured.

Furthermore, in the solid state relay of the above-noted configuration, the protective element may be mounted on a side of at least one of the lead frames that is the rear side to the side on which elements are mounted.

In this case, because the protective element is separated from the lead frame and any of the light-emitting element, the light-receiving element, or the light-receiving element and the switching element mounted on this lead frame that are opposite the protective element, in the solid state relay of the above-noted configuration, the electrical isolation distance between the light-receiving element and the light-emitting element within the device can be ensured.

Furthermore, in the solid state relay of the above-noted configuration, the lead frame opposite the protective element may be bent in the direction away from the protective element.

In this case, because the protective element is separated from the lead frame and any of the light-emitting element, the light-receiving element, or the light-receiving element and the switching element mounted on this lead frame that are opposite the protective element, in the solid state relay of the above-noted configuration, the electrical isolation distance between the light-receiving element and the light-emitting element within the device can be ensured.

Furthermore, in the solid state relay of the above-noted configuration, a concave portion for mounting the protective element may be formed in at least one of the lead frames.

In this case, because the protective element is separated from the lead frame and any element of the light-emitting element, the light-receiving element, or the light-receiving element and the switching element mounted on this lead frame that are opposite the protective element, in the solid state relay of the above-noted configuration, the electrical isolation distance between the light-receiving element and the light-emitting element within the device can be ensured.

Furthermore, in the solid state relay of the above-noted configuration, a floating island portion and a peripheral portion surrounding this floating island portion are provided in at least one of the lead frames; a plurality of mounting portions with different gaps between the floating island portion and the peripheral portion opposing each other are provided on the floating island portion and the peripheral portion that opposes this floating island portion; and the protective elements are mounted to bridge these mounting portions.

In this case, because the gaps between the floating island portion and the peripheral portion that oppose each other are different among the mounting portions, a plurality of the protective elements of different size can be mounted.

DESCRIPTION OF THE PREFERRED EMBODIMENTS

Embodiments of the present invention are explained below with reference to the drawings.

First Embodiment

Figure 1:
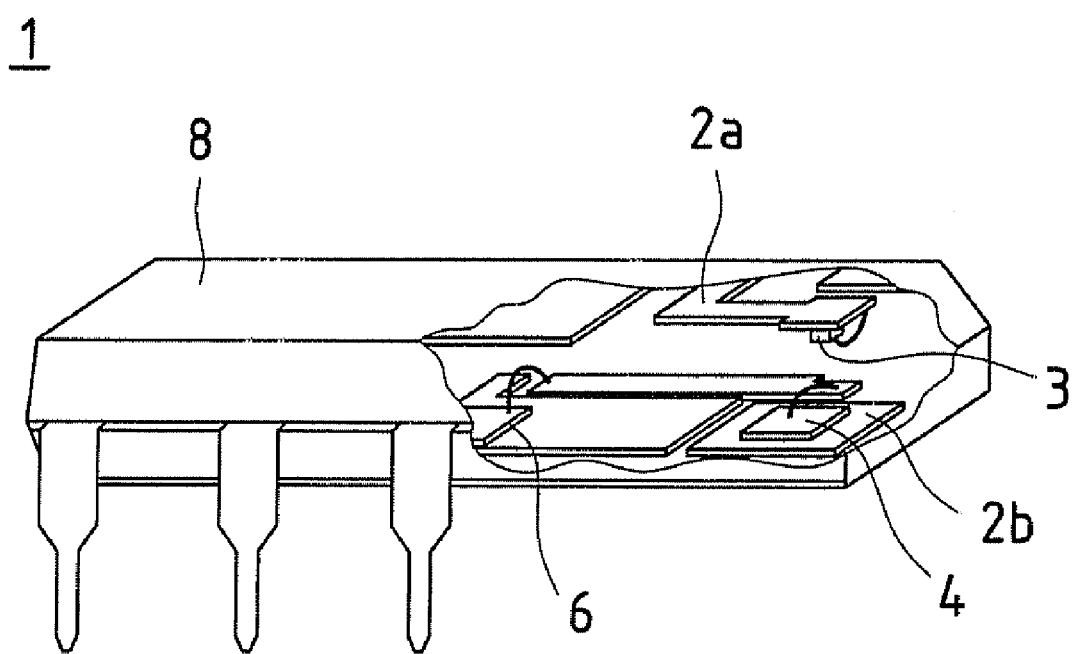
FIG. 1 is a perspective view showing a cutaway portion of a first embodiment of a solid state relay of the present invention.
Figure 2:
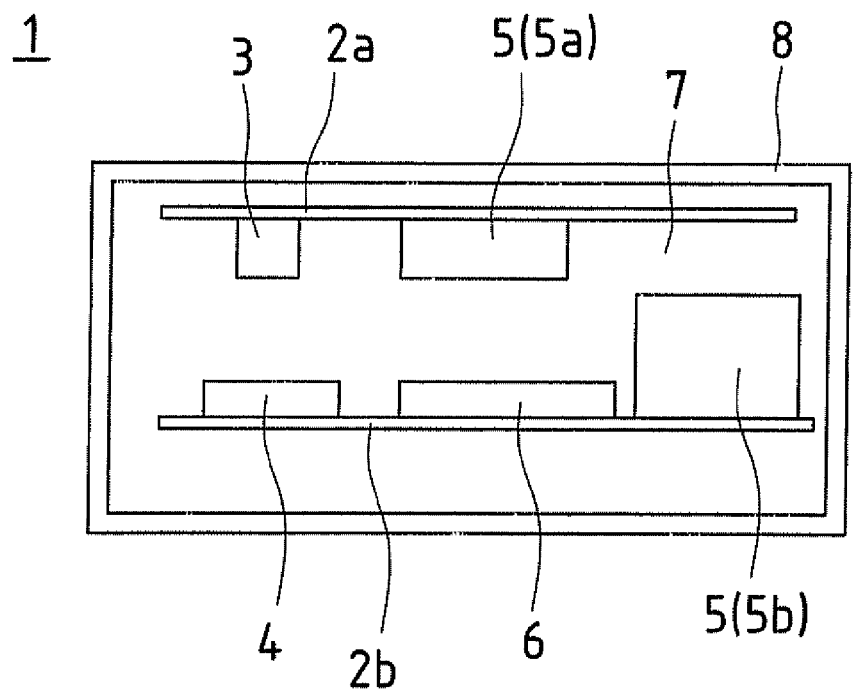
FIG. 2 is a cross-sectional view schematically showing the structure of the solid state relay shown in FIG. 1.

FIG. 1 and FIG. 2 show a first embodiment of a solid state relay 1 with a structure in which a light-emitting side lead frame 2a and a light-receiving side lead frame 2b are opposed.

This solid state relay 1 is formed by mounting a light-emitting element 3 and a protective element 5 (light-emitting element limiting resistor chip 5a) on the light-emitting side lead frame 2a, and mounting a light-receiving element 4, a switching element 6 which operates in response to signals from the light-receiving element 4, and a protective element 5 (chip resistor 5b) on the light-receiving side lead frames 2b, and sealing the lead frames 2a and 2b in one package.

The light-emitting side lead frame 2a and the light-receiving side lead frame 2b are arranged in opposition to one another. The elements 3, 4, 5, and 6 are respectively mounted on the lead frames 2a and 2b, after which primary mold resin sealing of the elements is carried out with a translucent resin 7, and further resin sealing is carried out with a black light blocking resin 8. Thus, by carrying out a transfer molding process once with the translucent resin 7, the formation of a light path and resin sealing of the light-emitting element 3, the light-receiving element 4, the protective elements 5, and the switching element 6 become possible, and the conventional step of mounting a light coupling element can be omitted.

It should be noted that the arrangement of the protective elements 5 is not limited to the above-noted arrangement, and it is also possible that only the light-emitting element limiting resistor chip 5a is mounted on the light-emitting side lead frame 2a or that only the chip resistor 5b is mounted on the light-receiving side lead frame 2b, for example.

Second Embodiment

Next, Embodiment 2 of the present invention is explained with reference to the drawings.

FIG. 3 to FIG. 9 shows the second embodiment of the present invention.

In the solid state relay 1 according to this embodiment, in order to ensure an electrical isolation distance between the light-receiving element and the light-emitting element within the device in the solid state relay 1 of the configuration according to the first embodiment, the protective elements 5 are arranged to be separated from the opposing lead frame 2a and the elements (in FIG. 3 to FIG. 9, the light-emitting element 3) mounted on this lead frame 2a, and there are the following variations, for example.

Figure 3:
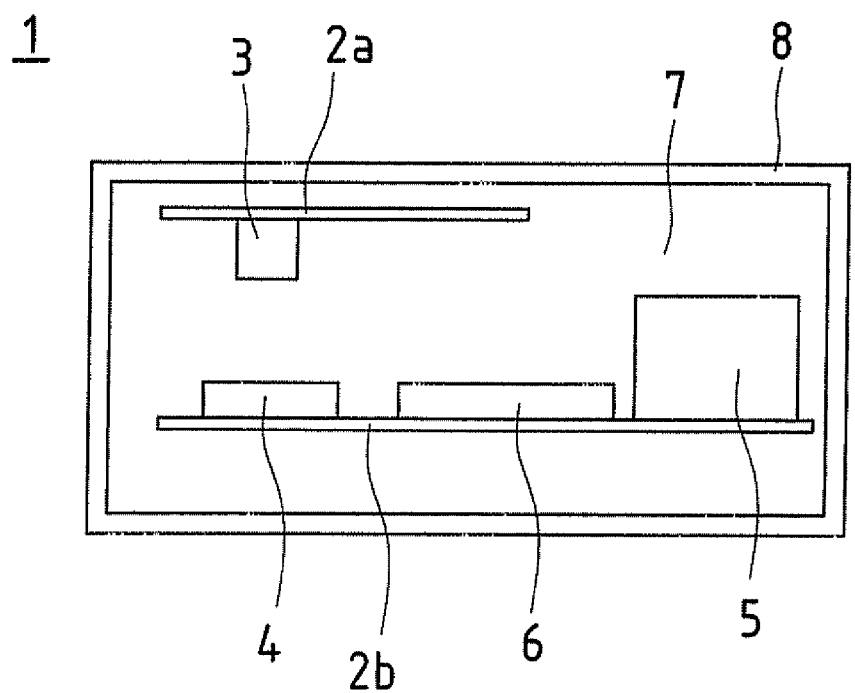
FIG. 3 is a cross-sectional view schematically showing the structure of a second embodiment of the solid state relay of the present invention.

In the solid state relay 1 shown in FIG. 3, the protective element 5 is mounted on a region on a front side that opposes the light-emitting side lead frame 2a of the light-receiving side lead frame 2b. Furthermore, the light-emitting side lead frame 2a is not present in the region opposite the protective element 5 mounted on a region on the front side of this light-receiving side lead frame 2b. In this case, because the light-emitting side lead frame 2a is not present in the region opposite the protective element 5, the protective element 5 can be separated from the light-emitting side lead frame 2a and the element (light-emitting element 3) mounted on this lead frame 2a. Thus, even if a protective element 5 thicker than, for example, the light-emitting element 3 and the light-receiving element 4 is mounted, the electrical isolation distance between the light-receiving element and the light-emitting element within the device can be ensured, for example.

It should be noted that the arrangement of the protective element 5 and the shape of the lead frames 2a and 2b are not limited to the above-noted case, and the arrangement of the protective element 5 and the shape of the lead frames 2a and 2b may also be such that the protective element 5 is mounted on a region on the front side of the light-emitting side lead frame 2a, and the light-receiving side lead frame 2b is not present in the region opposite the protective element 5, for example.

Figure 4:
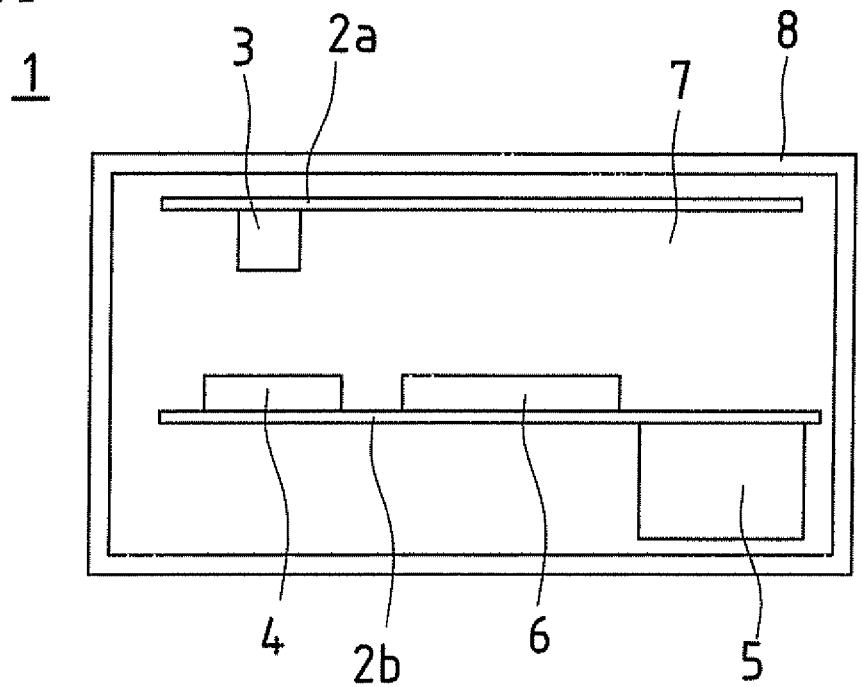
FIG. 4 is a cross-sectional view schematically showing the structure of the second embodiment of the solid state relay of the present invention.

In the solid state relay 1 shown in FIG. 4, the protective element 5 is mounted on the back side of the light-receiving side lead frame 2b, which does not face the light-emitting side lead frame 2a. In this solid state relay 1, the protective element 5 can be separated from the light-emitting side lead frame 2a and the element (light-emitting element 3) mounted on this lead frame 2a. Thus, even if a protective element 5 thicker than the light-emitting element 3 and the light-receiving element 4 is mounted, the electrical isolation distance between the light-receiving element and the light-emitting element within the device can be ensured.

It should be noted that the face on which the protective element 5 is mounted may be the back side of the light-emitting side lead frame 2a, which does not oppose the light-receiving side lead frame 2b.

Figure 5:
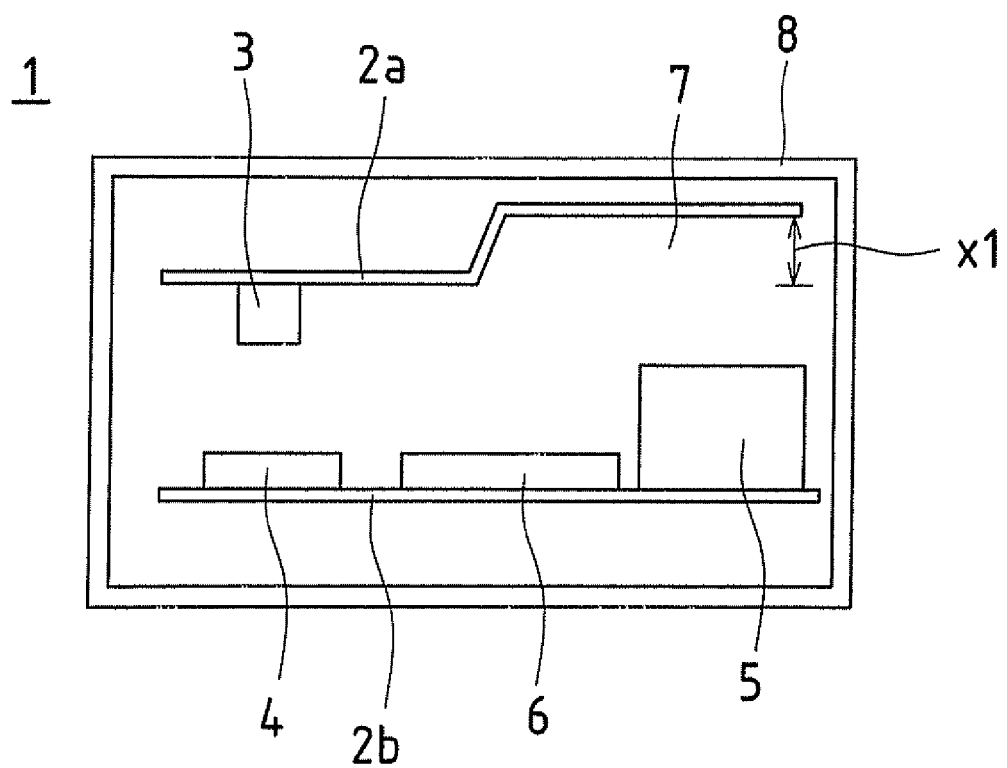
FIG. 5 is a cross-sectional view schematically showing the structure of the second embodiment of the solid state relay of the present invention.

In the solid state relay 1 shown in FIG. 5, the light-emitting side lead frame 2a that opposes the protective element 5 is bent in the direction away from the protective element 5. In this case, it is possible to further separate the protective element 5 from the light-emitting side lead frame 2a by a distance corresponding to a depth x1 of a bent portion of the light-emitting side lead frame 2a. Thus, even if a protective element 5 thicker than that of the light-emitting element 3 and the light-receiving element 4 is mounted, the electrical isolation distance between the light-receiving element and the light-emitting element within the device can be ensured, for example.

It should be noted that the arrangement of the protective element 5 and the shape of the lead frames 2a and 2b are not limited to the above-noted case, and the protective element 5 may also be mounted on the light-emitting side lead frame 2a, and the light-receiving side lead frame 2b that opposes the protective element 5 may be bent in the direction away from the protective element 5, for example.

Figure 6:
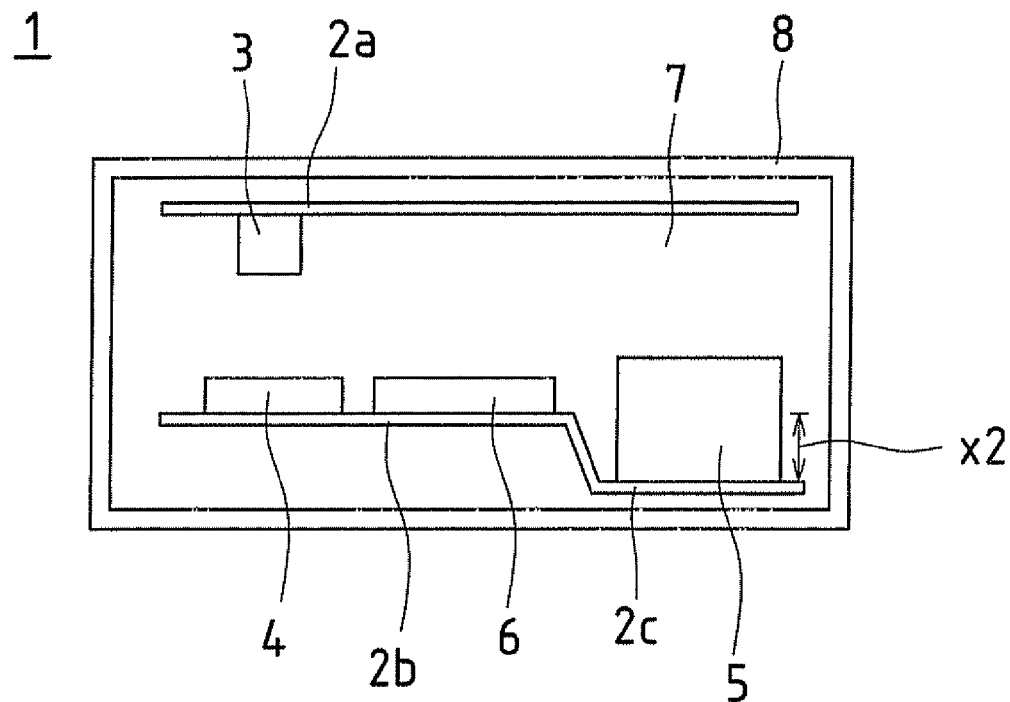
FIG. 6 is a cross-sectional view schematically showing the structure of the second embodiment of the solid state relay of the present invention.

In the solid state relay 1 shown in FIG. 6, a concave portion 2c onto which the protective element 5 is mounted is formed in the light-receiving side lead frame 2b.

This concave portion 2c is formed by bending a portion of the light-receiving side lead frame 2b in the direction away from the light-emitting side lead frame 2a. As a result of mounting the protective element 5 on the concave portion 2c, it is possible to further separate the protective element 5 from the light emitting side lead frame 2a by a distance corresponding to a depth x2 of the concave portion 2c. Thus, even if a protective element 5 thicker than the light-emitting element 3 and the light-receiving element 4 is mounted, the electrical isolation distance between the light-receiving element and the light-emitting element within the device can be ensured, for example.

Figure 7:
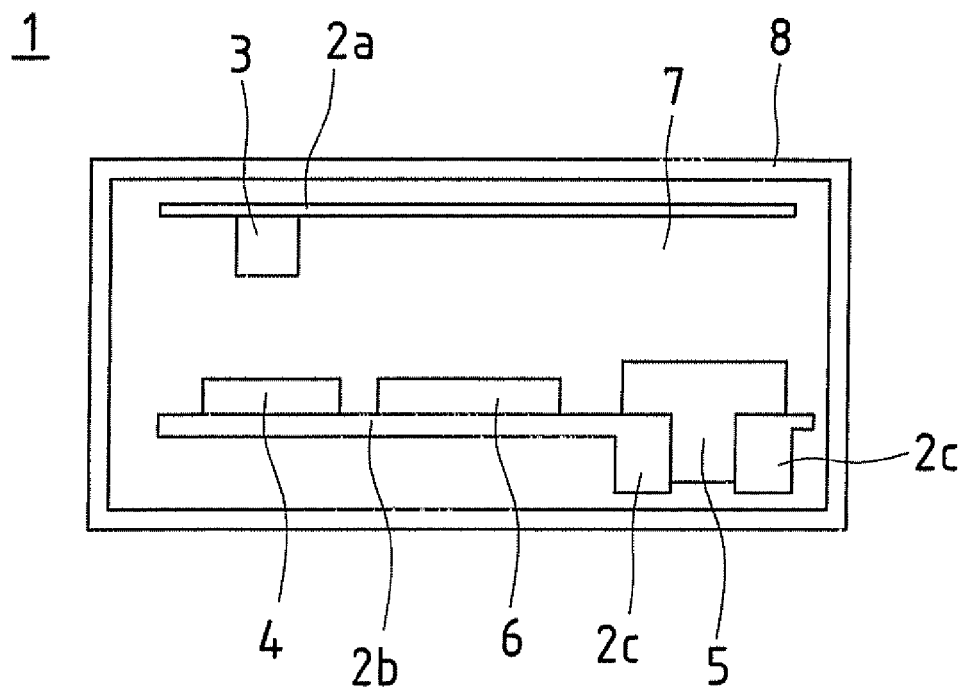
FIG. 7 is a cross-sectional view schematically showing the structure of a modified example of the solid state relay shown in FIG. 6.
Figure 8:
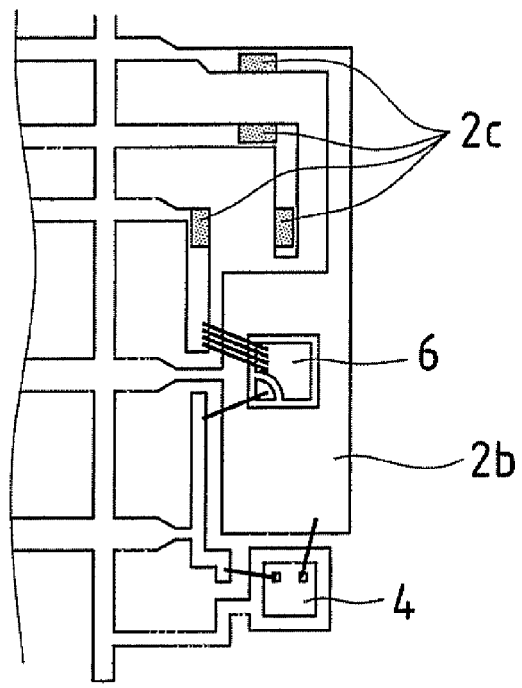
FIG. 8 is a top view showing the solid state relay shown in FIG. 7 with a portion of the lead frames omitted.
Figure 9:
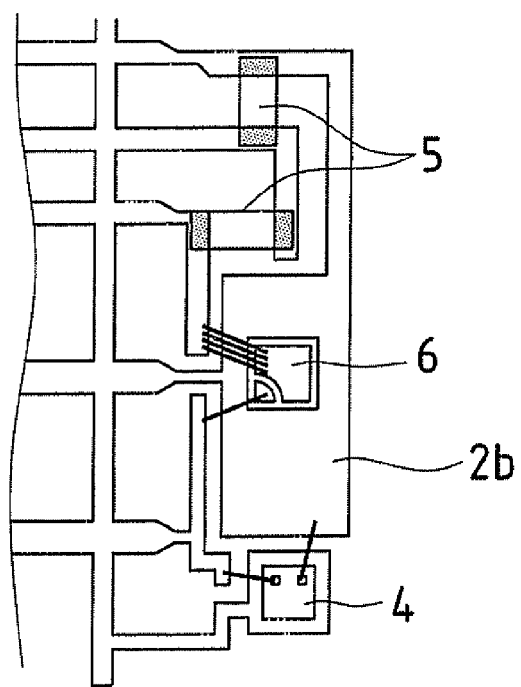
FIG. 9 is a top view showing the lead frames shown in FIG. 8 after protective elements have been mounted.

Furthermore, as shown in FIG. 7 and FIG. 8, it is also possible that only those portions of the concave portion 2c that contact the electrode portion of the protective elements 5 are processed into lowered shape. In this case, as shown in FIG. 9, the protective elements 5 are arranged to bridge the light-receiving side lead frame 2b (concave portions 2c). By providing such concave portions, it is not only possible to ensure the electrical isolation distance between the light-receiving element and the light-emitting element within the device, but it is also easy to position the protective elements 5 when they are mounted.

It should be noted that the arrangement of the protective element 5 and the shape of the lead frames 2a and 2b are not limited to the above-noted case shown in FIG. 6 and FIG. 7, and concave portions 2c onto which the protective elements 5 are mounted may also be formed on the light-emitting side lead frame 2a, for example.

Third Embodiment

Next, a third embodiment of the present invention is explained with reference to the drawings.

Figure 10:
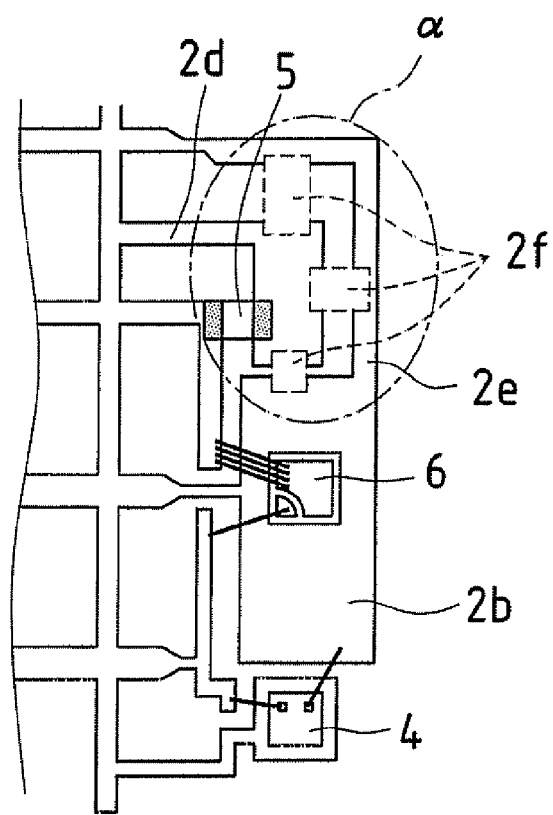
FIG. 10 is a top view showing a third embodiment of the solid state relay of the present invention with a portion of the lead frames omitted.
Figure 11:
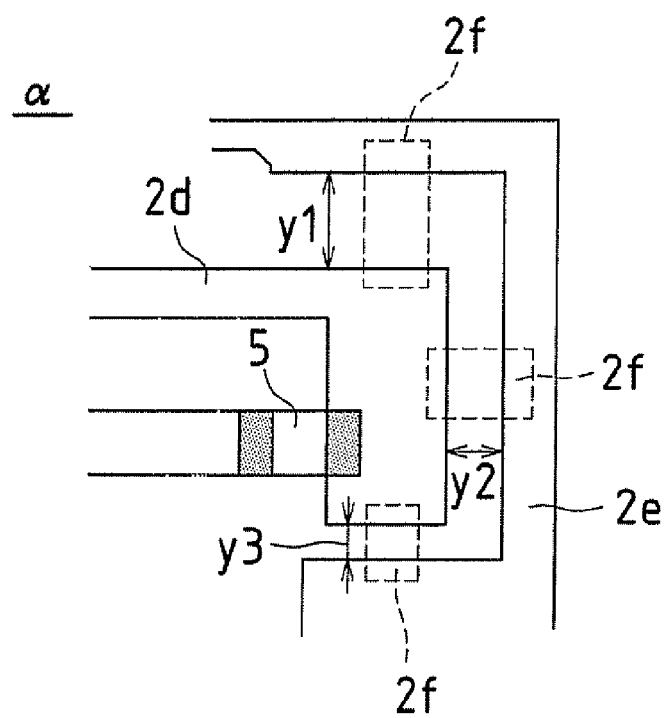
FIG. 11 is a partially enlarged view of the lead frames shown in FIG. 10.
Figure 12:
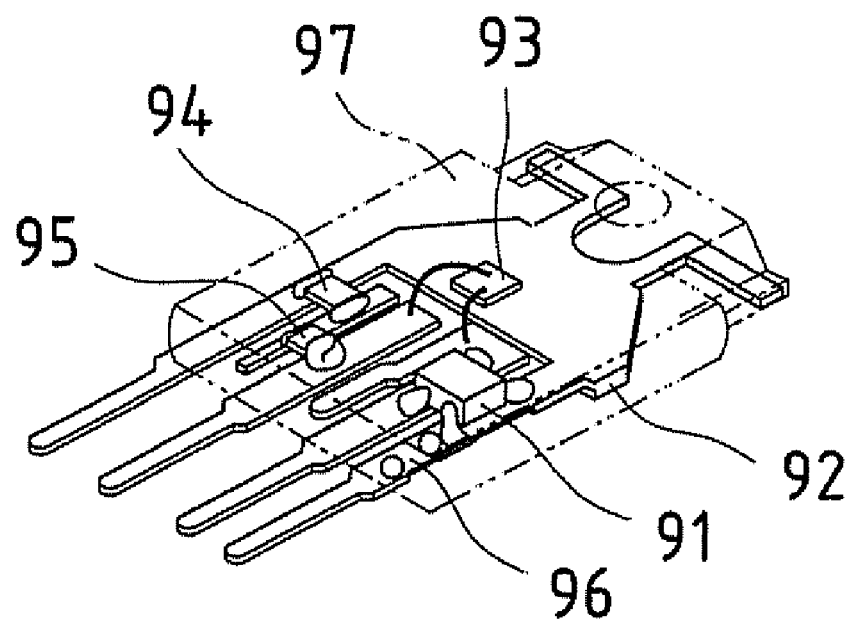
FIG. 12 is a diagram showing the internal structure of a conventional solid state relay.

FIG. 10 and FIG. 11 show the third embodiment of the present invention.

In the solid state relay 1 according to this embodiment, it is possible to suitably mount a plurality of protective elements of different sizes in the solid state relay 1 with a configuration according to the first or second embodiment.

In the solid state relay 1 shown in FIG. 10, a floating island portion 2d and a peripheral portion 2e surrounding this floating island portion 2d are provided on the light-receiving side lead frame 2b, a plurality of mounting portions 2f with different gaps between the opposing floating island portion 2d and the peripheral portion 2e are provided at the floating island portion 2d and the peripheral portion opposite the floating island portions 2d, and the protective elements 5 are mounted to bridge the mounting portions 2f.

Because the gaps (y1, y2, and y3) between the floating island portion 2d and the peripheral portion 2e vary among the mounting portions 2f in this manner as shown in FIG. 11, it is possible to suitably mount the plurality of protective elements 5 of different size onto the corresponding mounting portions 2f.

As described above, the present invention can be applied to solid state relays that simplify the assembly steps and make the devices smaller.

It should be noted that the invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for forming a solid state relay, comprising:

mounting a light-emitting element on a light-emitting side lead frame;

mounting a light-receiving element or a light-receiving element and a switching element which operates in response to signals from the light-receiving element on a light-receiving side lead frame;

arranging the light-emitting side and the light-receiving side lead frames in opposition to each other; and sealing the lead frames into one package, wherein protective elements that protect the light-emitting element or the light-receiving element is mounted on at least one of the lead frames, wherein the protective elements, or the protective elements and the switching element, are arranged inside a primary mold resin that seals the light-emitting element and the light-receiving element, wherein a floating island portion and a peripheral portion surrounding the floating island portion are provided in at least one of the lead frames, wherein a plurality of mounting portions with different gaps between the floating island portion and the peripheral portion opposing each other are provided at the floating island portion and the peripheral portion that opposes the floating island portion, and wherein the protective elements are mounted to bridge these mounting portions.

2. The solid state relay according to claim 1, wherein the protective elements are arranged to be separated from the lead frames in opposition to each other, and to be also separated from both of the light-emitting element and the light-receiving element or from all of the light-receiving element, the light-receiving element and the switching element mounted on the lead frames.

3. The solid state relay according to claim 2, wherein the protective elements are mounted opposite a region where the lead frame is not present.

4. The solid state relay according to claim 2, wherein the protective elements are mounted on a side of at least one of the lead frames that is the rear side to the side on which the light-receiving, light-emitting and/or switching elements are mounted.

5. The solid state relay according to claim 2, wherein the lead frame opposite the protective elements is bent in the direction away from the protective elements.

6. The solid state relay according to claim 2, wherein a lowered portion for mounting the protective elements is formed in at least one of the lead frames.

* * * * *